(12) United States Patent
Zhang et al.

(10) Patent No.: US 9,754,799 B2
(45) Date of Patent: Sep. 5, 2017

(54) FABRICATION METHOD OF INTERCONNECT STRUCTURE

(71) Applicant: Semiconductor Manufacturing International (Shanghai) Corporation, Shanghai (CN)

(72) Inventors: Chenglong Zhang, Shanghai (CN); Haiyang Zhang, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 6 days.

(21) Appl. No.: 14/882,581

(22) Filed: Oct. 14, 2015

(65) Prior Publication Data

US 2016/0111329 A1 Apr. 21, 2016

(30) Foreign Application Priority Data

Oct. 16, 2014 (CN) .......................... 2014 1 0549365

(51) Int. Cl.
| | |
|---|---|
| *H01L 21/44* | (2006.01) |
| *H01L 21/3213* | (2006.01) |
| *H01L 21/768* | (2006.01) |
| *H01L 23/532* | (2006.01) |

(52) U.S. Cl.
CPC .. *H01L 21/32135* (2013.01); *H01L 21/32136* (2013.01); *H01L 21/32139* (2013.01); *H01L 21/76885* (2013.01); *H01L 21/76897* (2013.01); *H01L 23/53214* (2013.01); *H01L 23/53228* (2013.01); *H01L 23/53257* (2013.01); *H01L 2924/0002* (2013.01)

(58) Field of Classification Search
CPC ............. H01L 21/0276; H01L 21/0332; H01L 21/32135; H01L 21/76834; H01L 21/76877; H01L 21/76885; H01L 21/76892; H01L 21/76897; H01L 23/5226; H01L 23/53214; H01L 23/53257
USPC .................................................. 438/652, 687
See application file for complete search history.

(56) References Cited

U.S. PATENT DOCUMENTS

2007/0111487 A1* 5/2007 Kim ........................ H01L 27/24
438/478
2015/0056800 A1* 2/2015 Mebarki ........... H01L 21/76885
438/652

* cited by examiner

*Primary Examiner* — Hung Vu
(74) *Attorney, Agent, or Firm* — Anova Law Group, PLLC

(57) ABSTRACT

A method for forming an interconnect structure is provided. The method includes providing a substrate with a surface; and forming a metal layer covering the surface of the substrate and with a desired grain size to reduce grain boundary scattering of the interconnect structure subsequently formed with the metal layer. The method also includes etching the metal layer to form a plurality of metal lines on the surface of the substrate and a plurality of metal pillars on each of the plurality of metal lines of the interconnect structure; and forming a dielectric layer covering the surface of the substrate, surfaces of the metal lines, and side surfaces of the metal pillars.

15 Claims, 7 Drawing Sheets

FABRICATION METHOD OF INTERCONNECT STRUCTURE

CROSS-REFERENCES TO RELATED APPLICATIONS

This application claims the priority of Chinese patent application No. 201410549365.X, filed on Oct. 16, 2014, the entirety of which is incorporated herein by reference.

FIELD OF THE INVENTION

The present invention generally relates to the field of semiconductor manufacturing technology and, more particularly, relates to interconnect structures and fabrication processes thereof.

BACKGROUND

With the continuous development of ultra-large integration (ULI), the critical dimension (CD) of semiconductor devices has become smaller and smaller. Further, the functionalities of the semiconductor devices have also become broader and broader. The integration level of integrate circuits (ICs) has been developed into a scale where hundreds of millions, or a few billions of devices are integrated in one chip. At the same time, multilayer interconnect techniques utilizing more than two layers of metal interconnect structures have been widely used.

The conventional interconnect structures are usually made of aluminum. With the continuous dimension-reduction of the semiconductor devices, although the size of interconnect structures is continuously reduced, the electric current passing through the interconnect structures has become larger and larger. Further, the responding time of the interconnect structures are required to be shorter and shorter. Thus, the conventional aluminum interconnect structures are unable to match the desired requirements. Therefore, copper has gradually substituted aluminum in the interconnect structures.

Comparing with aluminum, copper has a lower resistivity, and a better anti-electromigration performance. Thus, copper interconnect structures are able to lower the resistance-capacitance (RC) delay of the interconnect structures; improve the anti-electromigration ability; and enhance the reliability of the ICs. Therefore, substituting the aluminum interconnect structures with the copper interconnect structures has become a trend for developmental of the interconnect technology of ICs.

However, although using Cu as a material of interconnect structure is able to improve the performance of interconnect structure, the performance of the interconnect structure needs further improvement, especially when the node dimension further shrinks. The disclosed device structures and methods are directed to solve one or more problems set forth above and other problems.

BRIEF SUMMARY OF THE DISCLOSURE

One aspect of the present disclosure includes a method for fabricating an interconnect structure. The method includes providing a substrate with a surface; and forming a metal layer covering the surface of the substrate and with a desired grain size to reduce grain boundary scattering of the interconnect structure subsequently formed with the metal layer. The method also includes etching the metal layer to form a plurality of metal lines on the surface of the substrate and a plurality of metal pillars on each of the plurality of the metal lines of the interconnect structure; and forming a dielectric layer covering the surface of the substrate, surfaces of the metal lines, and side surfaces of the metal pillars.

Another aspect of the present disclosure includes an interconnect structure. The interconnect structure includes a substrate with a surface; and a plurality of metal lines formed on the surface of the substrate. The interconnect structure also includes a plurality of metal pillars on each of the metal lines; and a dielectric layer covering the surface of the substrate. Wherein the metal lines and the metal pillars are formed by forming a metal layer covering the surface of the substrate with a desired grain size to reduce grain boundary scattering of the interconnect structure; and etching the metal layer to form the plurality of metal lines on the surface of the substrate and the plurality of metal pillars on each of the plurality of the metal lines.

Other aspects of the present disclosure can be understood by those skilled in the art in light of the description, the claims, and the drawings of the present disclosure.

DETAILED DESCRIPTION

Figure 1:
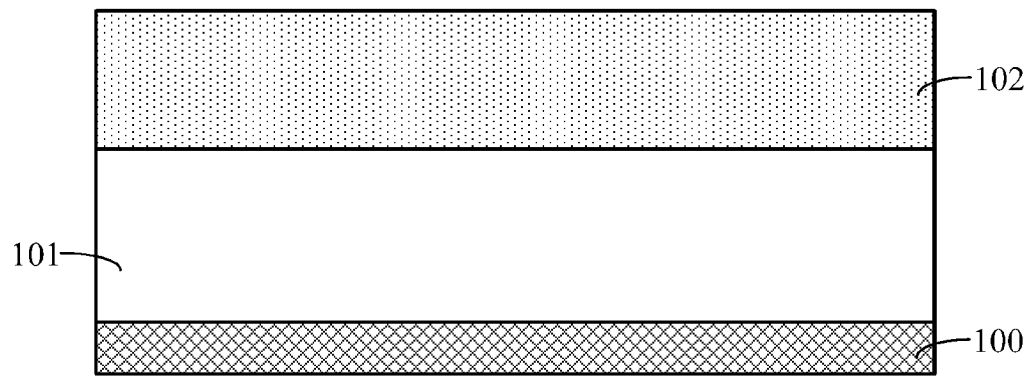
FIGS. 1~19 illustrate semiconductor structures corresponding to certain stages of an exemplary fabrication process of an interconnect structure consistent with the disclosed embodiments.

Reference will now be made in detail to exemplary embodiments of the invention, which are illustrated in the accompanying drawings. Wherever possible, the same reference numbers will be used throughout the drawings to refer to the same or like parts.

Double-Damascene structure is an interconnect structure. A process for forming an interconnect structure with a Double-Damascene structure includes various steps, such as Step 1, providing a substrate having a dielectric layer formed on the substrate; Step 2, forming a first mask layer defining the position and shape of the subsequently formed trench on the dielectric layer; Step 3, forming the trench in the dielectric layer by etching a partial thickness of the dielectric layer using the first mask layer as an etching mask; Step 4, forming a second mask layer defining the position and the shape of the subsequently formed through-hole on a portion of the trench and the surface of the dielectric layer; Step 5, forming the through-hole in the dielectric layer under the trench by etching the dielectric layer until the surface of the substrate is exposed; and Step 6, forming a metal layer in the trench and the through-hole. The portion of the metal layer in the through-hole is configured as the metal pillar of the interconnect structure; and the portion of the metal layer in the trench is configured as the metal line of the interconnect structure.

The metal layer may be made of Cu. With the continuous shrinking of the critical dimension of semiconductor structure, the size of the through-hole and the size of the trench are also continuously reduced. Thus, the growth of the crystal grains of the mental layer in the through-hole and the trench may be limited. Such a limitation may cause the grain size of the metal layer to become smaller and smaller. The continuous decreasing of the grain size of the metal layer may cause the grain size to be equivalent with the Mean Free Path of the electrons, or smaller than the Mean Free Path of the electrons. Thus, the surface scattering of the metal layer may be increased. The surface scattering of the metal layer will be superimposed on the intrinsic acoustic scattering of the metal layer. The scattering time of the electrons is reduced; and the resistivity of the metal line and the metal pillar may be increased.

At the same time, when the grain size of the metal layer is equivalent with the Mean Free Path of the electrons, or smaller than the Mean Free Path of the electrons, the grain size of the metal layer may be substantially small, and the grain boundaries are increased. The effect of the grain boundary scattering to the resistivity of the metal line and the metal pillar of the interconnect structure may not be ignored.

Further, because the growth of the grains of the metal layer is limited, the quality of the metal layer may be adversely affected. Further, the filling ability of the metal layer into the through-hole and the metal line is reduced. Thus, the electrical properties of the interconnect structure is further affected.

Further, in order to decrease the parasitic capacitance and the RC delay of the interconnect structure, low dielectric constant or ultra-low dielectric constant material may be used as the material of the dielectric layer of the interconnect structure. Further, in order to decrease the dielectric constant, the low dielectric constant or ultra-low dielectric constant material often has a porous and loose structure. Because the dielectric layer may have the porous and loose structure, the dielectric layer may be easily damaged during the process for etching the trench and the through-hole, etc. Thus, the electrical properties and the reliability of the interconnect structure may be further affected. According to the disclosed processes and device structures, the grain boundary scattering issue, the damage to the dielectric layer and other related issues may be at least partially overcome by forming an initial metal layer with a size comparable to the size of the substrate to have relatively large grain size; and etching the initial metal layer to form the metal lines and metal pillar and before forming a dielectric layer.

Figure 19:
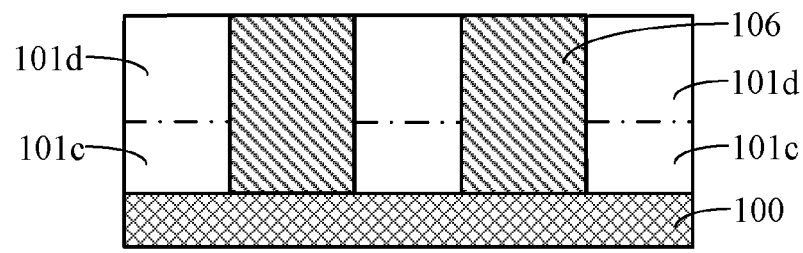
Figure 20:
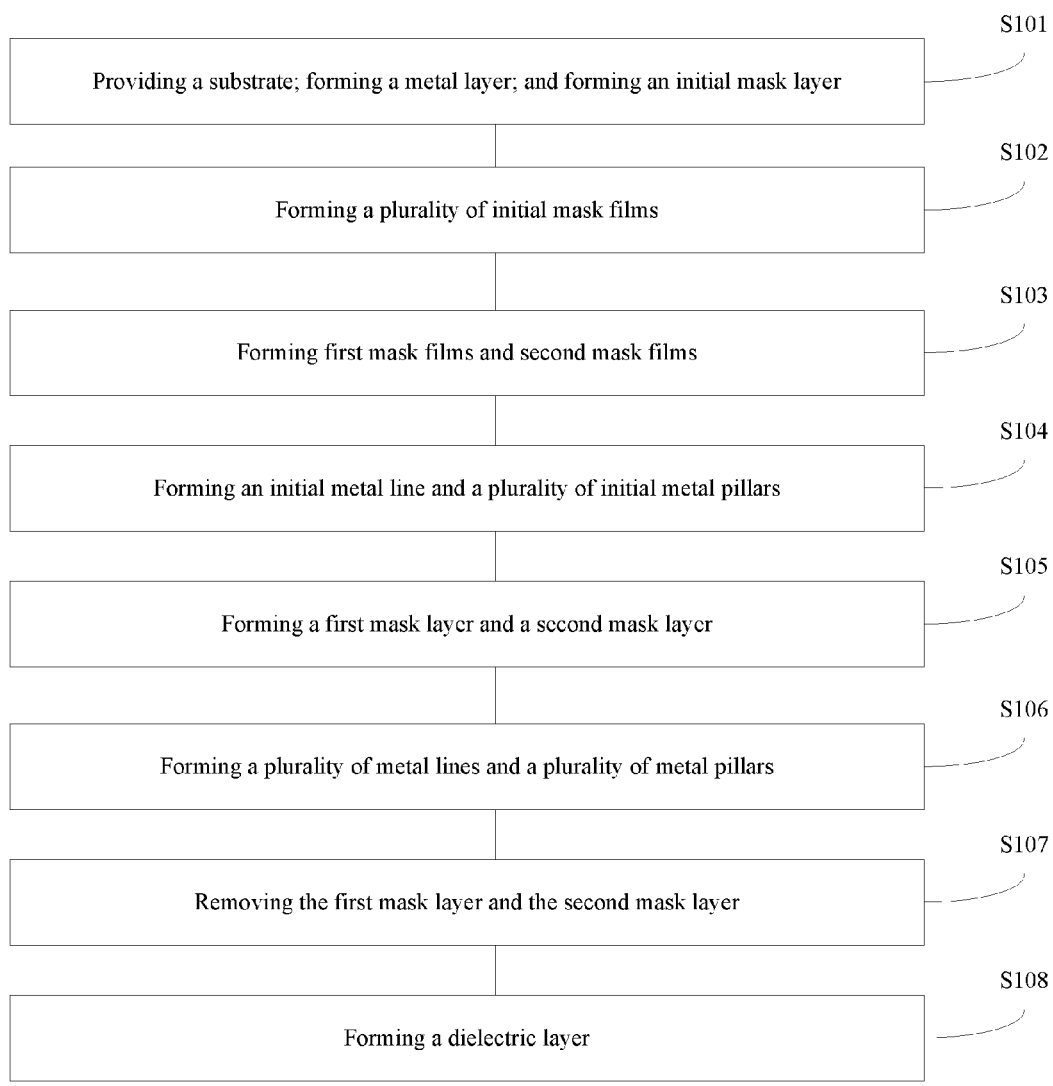
FIG. 20 illustrates an exemplary fabrication process of an interconnect structure consistent with the disclosed embodiments.

FIG. 20 illustrates an exemplary fabrication process of an interconnect structure consistent with the disclosed embodiments; and FIGS. 1~19 illustrate structures corresponding to certain stages of the exemplary fabrication process.

As shown in FIG. 20, at the beginning of fabrication process, a substrate with certain structures is provided (S101). FIG. 1 illustrates a corresponding structure.

As shown in FIG. 1, a substrate 100 is provided; and a metal layer 101 is formed on the surface of the substrate 100. Further, an initial mask layer 102 is formed on the metal layer 101.

The substrate 100 may be made of any appropriate semiconductor materials, such as single crystal silicon, polysilicon, silicon on insulator (SOI), silicon germanium, silicon carborundum, indium antimonite, lead telluride, indium arsenide, indium phosphide, gallium arsenide, gallium antimonite, alloy semiconductor, or a combination thereof. The substrate 100 also provides a base for subsequent devices and processes.

Further, a plurality of interface layers, and/or a plurality of strain layers may be formed on the surface of the substrate 100 to improve the performance of the device structures. Further, a plurality of semiconductor devices may be formed in the substrate 100. The semiconductor devices may include NMOS transistors, PMOS transistors, CMOS transistors, resistors, capacitors, or inductors, etc. Further, a bottom metal layer (not shown) may be formed in the substrate 100; and the top surface of the bottom metal layer may level with the surface of the substrate 100.

The metal layer 101 may be made of any appropriate material, such as Cu, Al, or W, etc. In one embodiment, the metal layer 101 is made of Cu.

In one embodiment, the metal layer 101 may be a multi-layer structure. The metal layer 101 may include a seed layer formed on the surface of the substrate 100; and a first metal body layer (not shown) on the seed layer. In certain other embodiments, the metal layer 100 is a single layer structure.

The seed layer may be configured as the cathode of an electroplating process for forming the first metal body layer; and may make a preparation for forming the first metal body layer. The seed layer may also provide a desired interface status for forming the first metal body layer. Thus, it may aid to form the first metal body layer having a tight bonding with the seed layer; and improve the electromigration of the semiconductor structure.

The seed layer may be formed by any appropriate process, such as a chemical vapor deposition (CVD) process, a physical vapor deposition (PVD) process, an atomic layer deposition (ALD) process, or a flowable CVD (FCVD) process, etc. In one embodiment, the seed layer is formed by a PVD process. The thickness of the seed layer may be in a range of approximately 10 Å~200 Å. The seed layer may be made of any appropriate material, such as Cu, Al, or W, etc.

The metal body layer may be made of any appropriate material, such as Cu, Al, or W, etc. In one embodiment, the metal body layer is made of Cu.

Various processes may be used to form the first metal body layer, such a PVD process, a CVD process, or an electroplating process, etc. In one embodiment, the first metal body layer is formed by an electroplating process. That is, the substrate 100 having the seed layer may be transferred to an electroplating cell; and the first metal body layer is formed by an electroplating process.

The electroplating cell may have electroplating solution inside, a copper anode and the cathode and anode of a power source. The electroplating solution may comprise $CuSO_4$, $H_2SO_4$ and $H_2O$, etc. The electroplating solution may also include a plurality of additives, such as catalyst, inhibitor, and adjusting agents, etc.

The electroplating process may include connecting the seed layer with the cathode of the power source; and connecting the copper anode with the anode of the power source. The copper atoms in the copper anode may be turned into copper ions by an oxidation reaction. The copper ions near the cathode may be turned into copper atoms by a reduction reaction. The copper atoms formed by the reduction reaction may be deposited on the surface of the seed layer.

Because the metal layer 101 may be formed on the surface of the substrate 100, and the surface size of the substrate 100 may be relatively large, the size of the metal layer 101 formed on the substrate 100 may also be relatively large. During the formation of the metal layer 101, the growth of the crystal grains may not be limited. Thus, the grain size of the metal layer 101 may be relatively large. Correspondingly, the grain boundaries in the metal layer 101 may be less; and the grain boundary scattering in the metal layer 101 may be relatively weak. Thus, the resistivity of the metal layer 101 may be relatively low, and the metal lines and the metal pillars subsequently formed from the metal layer 101 may have a relatively smaller resistivity.

In one embodiment, in order to improve the quality of the initial mask layer subsequently formed on the metal layer 101, the metal layer 101 may be planarized after forming the metal layer 101. The metal layer 101 may be planarized by any appropriate process. In one embodiment, a chemical mechanical polishing (CMP) process is used to planarize the metal layer 101 after forming the metal layer 101.

The thickness of the metal layer 101 may be any appropriate value. In one embodiment, the thickness of the metal layer 101 is in a range of approximately 100 Å~5000 Å.

The initial mask layer 102 may provide a process base for subsequently forming a first mask layer and a second mask layer on the first mask layer. The first mask layer may be used to subsequently form metal lines. Thus, the first mask layer may define the position and structure of the subsequently formed metal lines. The second mask layer may be used to form metal pillars. Thus, the second mask layer may define the position and the structure of the subsequently formed metal pillars.

The initial mask layer 102 may be made of any appropriate material, such as one or more of silicon nitride, silicon oxide, silicon carbide, silicon oxynitride, or silicon carbonitride, etc. Thus, the subsequently formed mask layers may be referred as hard mask (HM) layers.

The initial mask layer 102 may be a single layer structure, or a multiple layer structure. In one embodiment, the first mask layer and the second mask layer formed from the initial mask layer 102 may be made of a same material. That is, the initial mask layer 102 may be a single layer structure; and the initial mask layer 102 may be made of silicon oxide.

In certain other embodiments, the initial mask layer 102 is a multiple-layer structure, such as a triple-layer structure. The first mask layer and the second mask layer subsequently formed from the initial mask layer may be made of different materials such that the first mask layer and the second mask layer may be have a significantly large etching selectivity.

Figure 2:
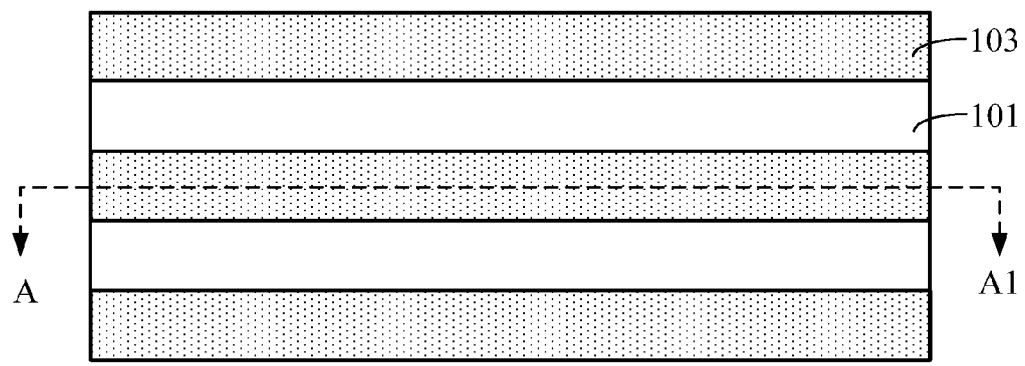
Figure 3:
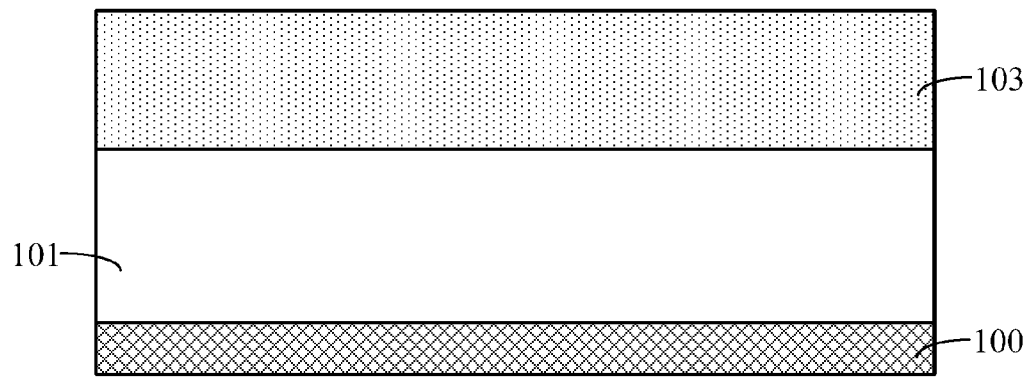

Returning to FIG. 20, after providing the substrate 200, forming the metal layer 101 and forming the initial mask layer 102, a plurality of discrete initial mask films may be formed (S102). FIGS. 2~3 illustrate a corresponding structure. FIG. 2 is a top view of the structure; and FIG. 3 is a cross-sectional view of the structure illustrated in FIG. 2 along the "AA1" direction.

As shown in FIGS. 2~3, a plurality of initial mask films 103 are formed on the surface of the metal layer 101. The plurality of initial mask films 103 may be formed by patterning (etching) the initial mask layer 102 until the surface of the metal layer 101 is exposed.

In one embodiment, the plurality of the initial mask films 103 may provide a technical base for subsequently forming first mask layers and second mask layers. Further, the initial mask films 103 may define the position and shape of the subsequently formed metal lines. Thus, the initial mask films 103 may cover the positions of the metal layer 101 corresponding to subsequently formed metal lines.

In one embodiment, a process for forming the plurality of initial mask films 103 may include forming a photoresist layer (not shown) on the initial mask layer 102; exposing and developing the photoresist layer to form a patterned photoresist layer; and etching the initial mask layer 102 until the surface of the metal layer 101 is exposed using the patterned photoresist layer as an etching mask. Thus, the plurality of discrete initial mask films 103 may be formed. After forming the plurality of the discrete initial mask films 103, the patterned photoresist layer may be removed.

The photoresist layer may be formed by a spin-coating process, etc. Various processes may be used to etch the initial mask layer 102, such as a dry etching process, a wet etching process, or an ion beam etching process, etc. The patterned photoresist layer may be removed by any appropriate process, such as a dry etching process, a wet etching process, or a plasma ashing process, etc.

Optionally, a bottom antireflective coating (BARC) or an organic depositing coating (ODC) may be formed on the initial mask layer 102 before forming the photoresist layer. After forming the photoresist layer, a top antireflective layer (TARC) may be formed on the photoresist layer. The BARC, the ODC and the TARC may be formed by a spin-coating process, etc.

Figure 4:
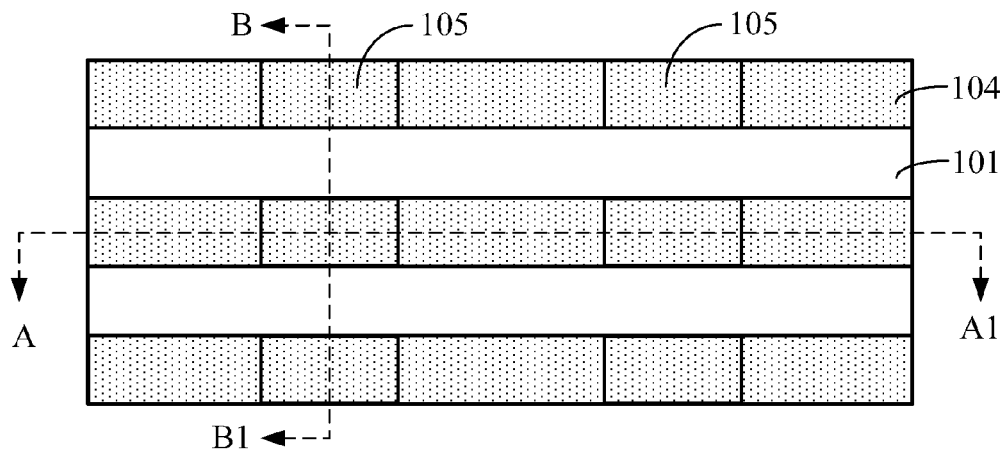
Figure 5:
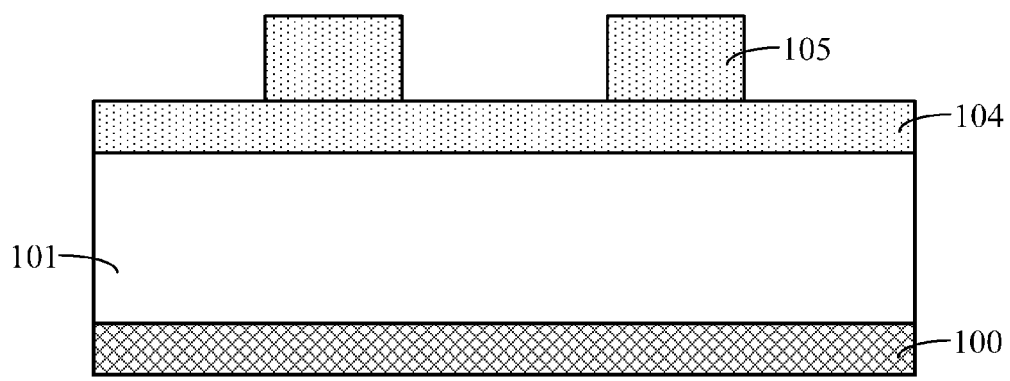
Figure 6:
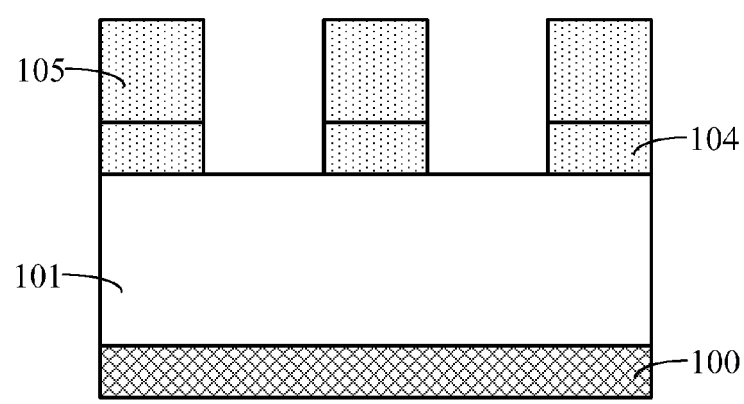

Returning to FIG. 20, after forming the plurality of initial mask films 103, first mask films and second mask films may be formed (S103). FIGS. 4~6 illustrates a corresponding structure. FIG. 4 is a top view of the structure. FIG. 5 illustrates a cross-sectional view of the structure illustrated in FIG. 4 along the "AA1" direction; and FIG. 6 illustrates a cross-sectional view of the structure illustrated in FIG. 4 along the "BB1" direction.

As shown in FIGS. 4~6, the plurality of initial mask films 103 are formed into a plurality of the first mask films 104; and a plurality of second mask films 105 are formed on each of first mask films 104. The first mask films 104 and the second mask films 105 may be formed by etching portions of the initial mask films 103 with a predetermined depth. That is, the top portion (partial thickness) of portions of the initial mask films 103 may be removed. The none-removed portions of the initial mask films 103 with the predetermined thickness may be configured as the first mask films 104. The portion of the initial mask films 103 under the first mask films 104 may be configured as the second mask films 105.

The first mask films 104 may cover the portions of the metal layer 101 corresponding to the position and structure of the subsequently formed metal lines. The second mask films 105 may cover portions of the metal layer 101 corresponding to the position and structure of the subsequently formed metal pillars.

Specifically, a process for forming the first mask films 104 and the second mask films 105 may include, sequentially, forming a photoresist layer (not shown) on the initial mask films 103 and the exposed surface of the metal layer 101; exposing and developing the photoresist layer to form a patterned photoresist layer covering portions of the initial mask films 103; and etching portions of the initial mask films 103 with a pre-determined thickness. Thus, the first mask films 104 may be formed on the surface of the metal layer 101; and the second mask films 105 may be formed on the first mask films 104.

The patterned photoresist layer may define the position and shape of the subsequently formed metal pillars. After forming the second mask films 105, the patterned photoresist layer may be kept. When the portions of the first mask films 104 exposed by the first second mask films 105, e.g., not be covered by the second mask films 105, is subsequently removed, the patterned photoresist layer may protect the second mask films 105.

In one embodiment, the initial mask layer 102 is a single layer structure. Thus, the first mask films 104 and the second mask films 105 may be made of a same material. Further, during the subsequent process for etching the metal layer 101 using the first mask films 104 and the second mask films 105 as an etching mask, the etching process may also etch and remove the portion of the first mask films 104 exposed by the second mask films 105. In order to ensure the portions of the first mask films 104 exposed by the second mask films 105 to be removed, in one embodiment, the thickness of the second films 105 may be greater than the thickness of the first mask films 104.

In certain other embodiments, the initial mask layer 102 may be a multiple-layer structure. Thus, the first mask films 104 and the second mask films 105 may be made of different materials. Thus, the second mask films 105 may be subsequently used as an etching mask to etch the first mask films 104. That is, the first mask films 104 and the second mask films 104 may have an etching selectivity. Thus, the thickness of the first mask films 104 may be greater, equal to, or smaller than the thickness of the second mask films 105.

The first mask films 104 may be made of one or more of SiN, SiO, SiC, SiON, and SiCON. The second mask films 104 may be made of one or more of SiN, SiO, SiC, SiON, and SiCON.

In one embodiment, the first mask films 104 and the second mask films 105 are formed by etching the same initial mask layer 102 (as shown in FIG. 1). The process for forming the first mask films 104 and the second mask films 105 may be relatively simple. Thus, the manufacturing of semiconductor devices is simplified; and the production cost of semiconductor devices may be reduced. Further, before forming the first mask films 104 and the second mask films 105, the metal film 101 may not be etched. During the process for forming the first mask films 104 and the second films 105, the top surface of the metal layer 101 may keep same. The image error caused the complexity of the surface of the metal film 101 may be avoided. Thus, the first mask films 104 and the second mask films 105 may have desired morphology such that the position and the size of the subsequently formed metal lines and metal pillars may be accurate.

Figure 7:
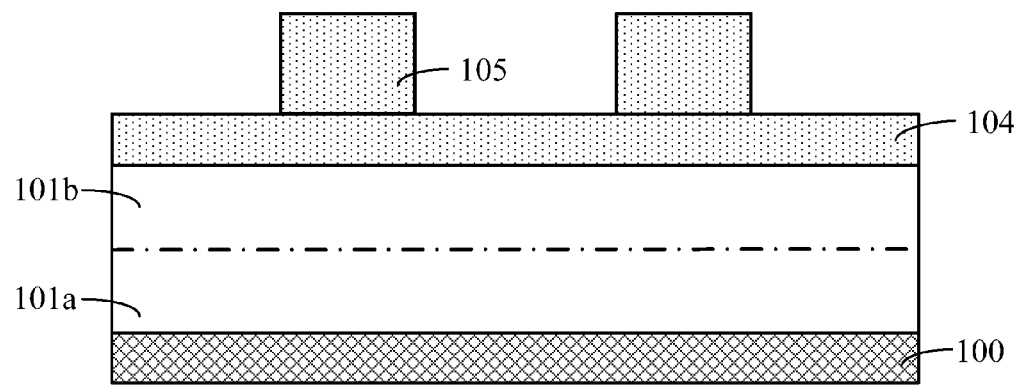
Figure 8:
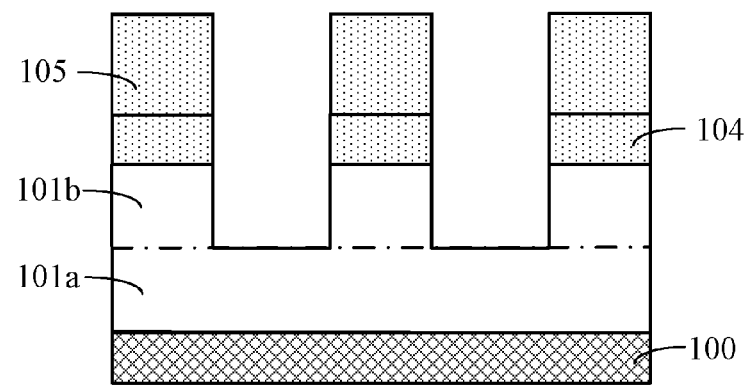

Returning to FIG. 20, after forming the first mask films 104 and the second mask films 105, an initial metal line and initial metal pillars may be formed (S104). FIGS. 7~8 illustrate a corresponding structure. FIG. 7 is a cross-sectional view of the corresponding structure based on the structure illustrated in FIG. 5; and FIG. 8 is a cross-sectional view of the corresponding structure based on the structure illustrated in FIG. 6.

As shown in FIGS. 5~6, an initial metal line 101a is formed on the surface of the substrate 100; and a plurality of initial metal pillars 101b are formed on the initial metal line 101a. The initial metal line 101a and the initial metal pillars 101b may be formed by etching portions of the metal layer 101 exposed by the first mask films 104 with a pre-determined depth (referring to FIG. 4~6).

In one embodiment, the initial metal line 101a may cover the entire surface of the substrate 100; and the surface of the substrate 100 may not be exposed. Thus, the subsequent etching process for forming metal lines and metal pillars may not damage the substrate 100.

The thickness of the initial metal line 101a may be equal to the thickness of the subsequently formed metal pillars. Thus, the thickness of the initial metal line 101a may be determined by the designed thickness of the subsequently formed metal pillars. Correspondingly, the pre-determined depth of the metal layer needed to be removed may be determined.

In one embodiment, the position and the surface size of the initial metal pillars 101b may be identical to the surface size and the position of the subsequently formed metal pillars. The initial metal lines 101a exposed by the initial metal pillars 101b may be subsequently etched until the surface of the substrate 100 is exposed.

The metal layer 101 may be etched by any appropriate process, such as a dry etching process, a wet etching process, or an ion beam etching process, etc. In one embodiment, the metal layer 101 is etched by a dry etching process to form the initial metal line 101a and the initial metal pillars 101b. The etching gas of the dry etching process may include $H_2$, etc. Carrier gas, such as Ar, or He, etc., may be fed into the reaction chamber of the dry etching process. The flow rate of $H_2$ may be in a range of approximately 20 sccm~200 sccm. The flow rate of the carrier gas may be in a range of approximately 10 sccm~100 sccm. The radio frequency power may be in a range of approximately 2000 W~5000 W. The radio frequency bias power may be in a range of approximately 100 W~500 W. The pressure of the reaction chamber may be in a range of approximately 1 Torr~20 Torr. The temperature of the reaction chamber may be in range of approximately 350° C.~600° C.

Figure 9:
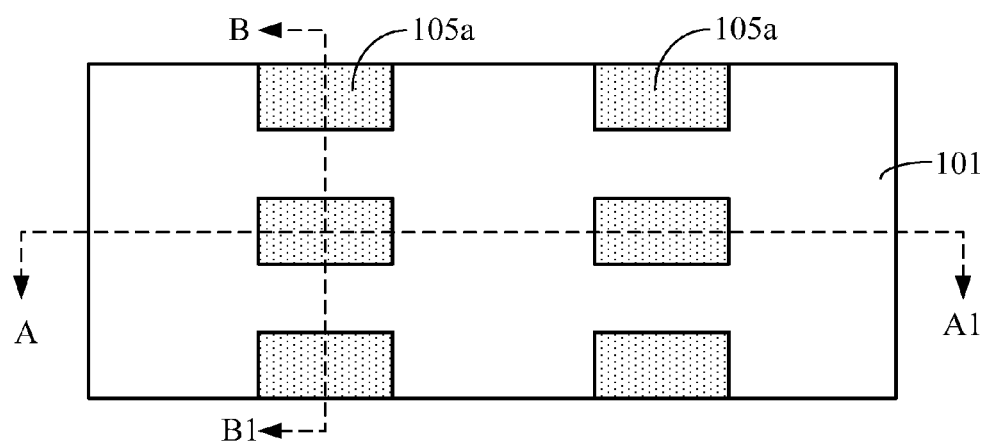
Figure 10:
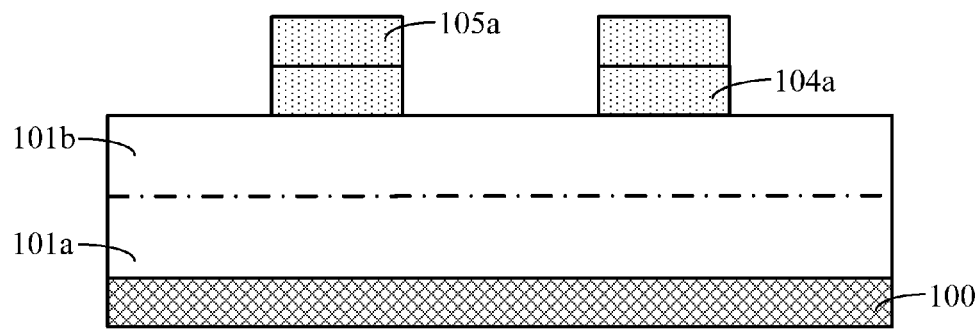
Figure 11:
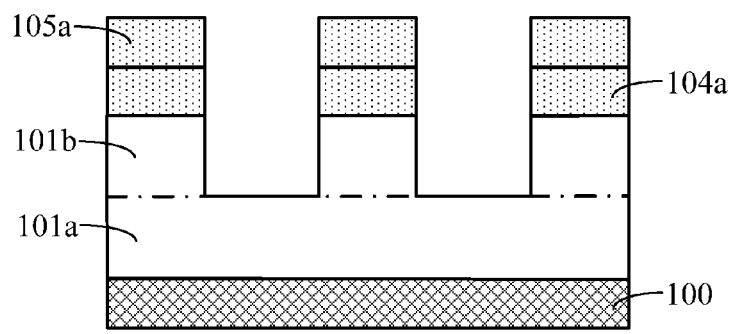

Returning to FIG. 20, after forming the initial metal line 101a and the initial metal pillars 101b, a first mask layer 104a and a second mask layer 105a may be formed (S105). FIGS. 9~11 illustrates a corresponding structure. FIG. 10 is a cross-sectional view of the structure illustrated in FIG. 9 along the "AA1" direction; and FIG. 11 illustrates a cross-sectional view of the structure illustrated in FIG. 9 along the "BB1" direction.

As shown in FIGS. 9~11, a first mask layer 104a is formed on portions of the initial metal pillar 101b; and a second mask layer 105a is formed on the surface of the first mask layer 104a. The first mask layer 104a and the second mask layer 105a may be formed by etching the portions of the first mask film 104 (as shown in FIG. 7 and FIG. 8) exposed by the second mask film 105 (as shown in FIG. 7 and FIG. 8).

Because after forming the initial metal line 101a having the initial metal pillars 101b, the position and the size of the subsequently formed metal lines may be defined. After forming the first mask layer 104a on the portions of the initial metal pillars 101b and the second mask layer 105a on the first mask layer 104a, the position and the size of the subsequently formed metal pillars may be defined.

In one embodiment, the first mask film 104 and the second mask film 105 may be made of a same material. Thus, after removing portions of the first mask film 104 using the second mask film 105 as an etching mask, the thickness of the second mask layer 105a, i.e., the thickness of the remaining second mask film 105, may be smaller than the thickness of the second mask film 105.

The portions of the first mask film 104 may be etched by any appropriate process, such as a dry etching process, a wet etching process, or an ion beam etching process, etc. In one embodiment, a plasma dry etching process is used to etch the portions of the first mask film 104. In one embodiment, the first mask layer 104 and the second mask layer 105 are both made of silicon oxide, the etching gas may include one or more of $CF_4$, $C_3F_8$, $C_4F_8$, $CHF_3$, $NF_3$, $SiF_4$, Ar, He, $O_2$ or $N_2$, etc. The flow rate of the mixture gas may be in a range of approximately 50 sccm~500 sccm. The bias voltage of the plasma may be in a range of approximately 50 V~600 V. The power of the plasma may be in a range of approximately 100 W~600 W. The temperature of the dry etching process may be in a range of approximately 30° C.~70° C.

In certain other embodiments, there may be a patterned photoresist layer on the second mask film 105 before removing the portions of the first mask film 104 exposed by the second mask film 105. The patterned mask layer may protect the second mask film 105 from being etched. Thus, after forming the first mask layer 104a and the second mask layer 105a, the thickness of the remaining second mask film 105 may be identical to the second mask layer 105a.

In still certain other embodiments, the first mask film 104 and the second mask film 105 may be made of different materials. The process for etching the first mask film 104 may have a significantly small etching rate to the second mask film 105.

In still certain other embodiments, in order to simplify the process steps, the portions of the first mask film 104 exposed by the second mask film 105 may be removed when the initial metal line 101a and the initial metal pillars 101b are being formed. The process may be performed until the portions of the initial metal pillars 101b are exposed.

Figure 12:
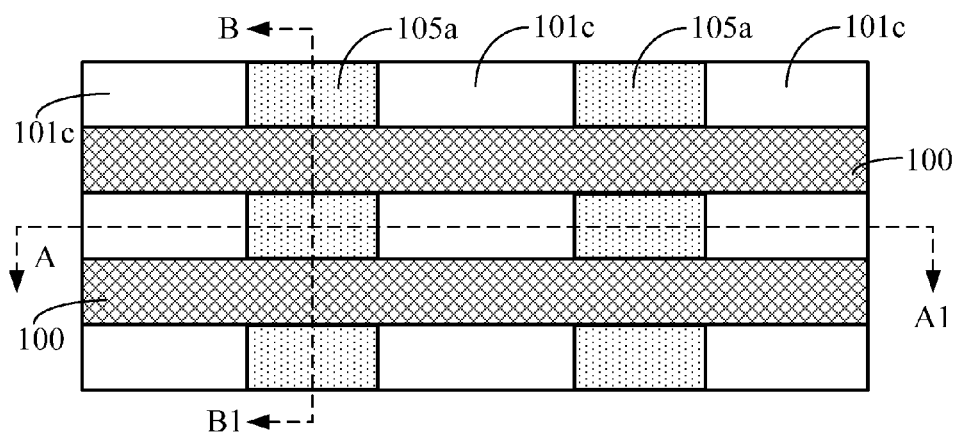
Figure 13:
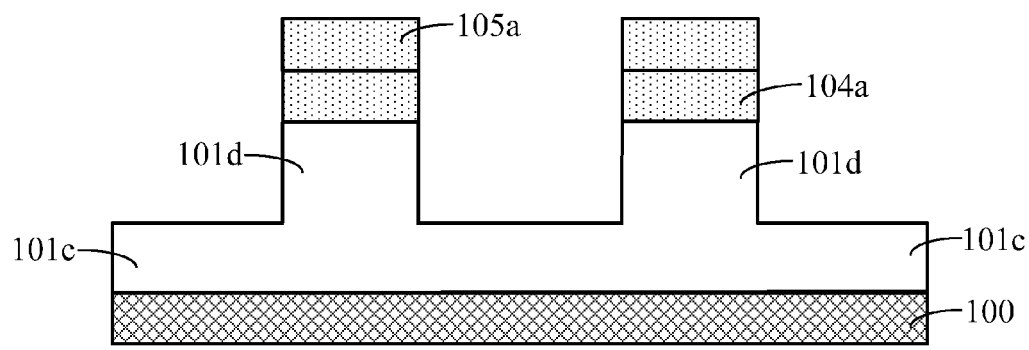
Figure 14:
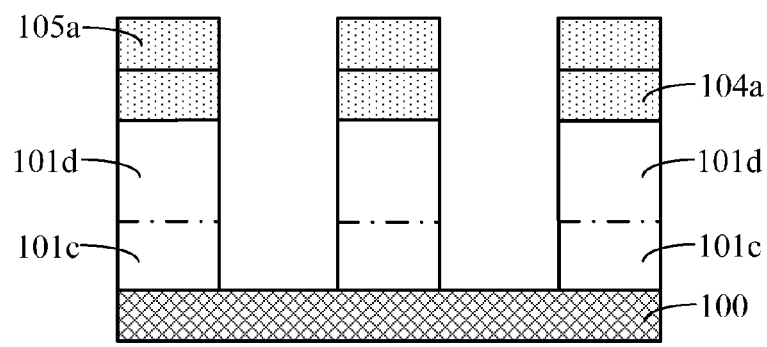

Returning to FIG. 20, after forming the first mask film 104a and the second mask film 105a, a plurality of discrete metal lines and a plurality of discrete metal pillars may be formed (S106). FIGS. 12~14 illustrate a corresponding structure. FIG. 13 is a cross-sectional view of the structure illustrated in FIG. 12 along the "AA1" direction; and FIG. 14 illustrate a cross-sectional view of the structure illustrated in FIG. 12 along the "BB1" direction.

As shown in FIGS. 12~14, a plurality of discrete metal lines 101c are formed on the surface of the substrate 100; and a plurality of the discrete metal pillars 101d are formed on each of the metal lines 101c. The metal lines 101c and the metal pillars 101d may be formed by etching the initial metal line 101a (as shown in FIGS. 9~11) using the second mask layer 105a as an etching mask until the surface of the substrate 100 is exposed; and etching the initial metal pillars 101b (as shown in FIGS. 9~11), simultaneously.

In one embodiment, the thickness of the metal pillars 101d may be identical to the difference between the thickness of the metal layer 101 (as shown in FIG. 1) and the thickness of the initial metal pillars 101b. That is, the thickness of the metal pillars 101d may be equal to the thickness of the initial metal lines 101a; and the thickness of the metal lines 101c may be equal to the thickness of the initial metal pillars 101b.

Various processes may be used to etch the initial metal line 101a and the initial metal pillars 101b, such as a dry etching process, a wet etching process, or an ion beam etching process, etc. In one embodiment, a dry etching process is used to etch the initial metal lines 101a and the initial metal pillars 101b to form the metal lines 101c and the metal pillars 101d. The etching gas of the dry etching process may include $H_2$, etc. Other parameters of the dry etching process may be similar with the previous parameters for etching the metal layer 101.

In one embodiment, during the process for etching the initial metal line 101a and the initial metal pillars 101b, the surface of the substrate 100 may always be covered. Thus, the surface of the substrate 100 may not be exposed in the etching environments. The surface of the substrate 100 may not be etched; and the reliability of the interconnect structure may be improved.

In one embodiment, the process for etching the metal layer 101, the process for etching the first mask film 104 and the process for etching the initial metal lines 101a may be performed in a same etching chamber. Thus, the time for installing and un-installing the substrate 100 in the reaction chamber may be reduced; and the pollution to external environments may be reduced. Therefore, the production cost may be reduced.

Figure 15:
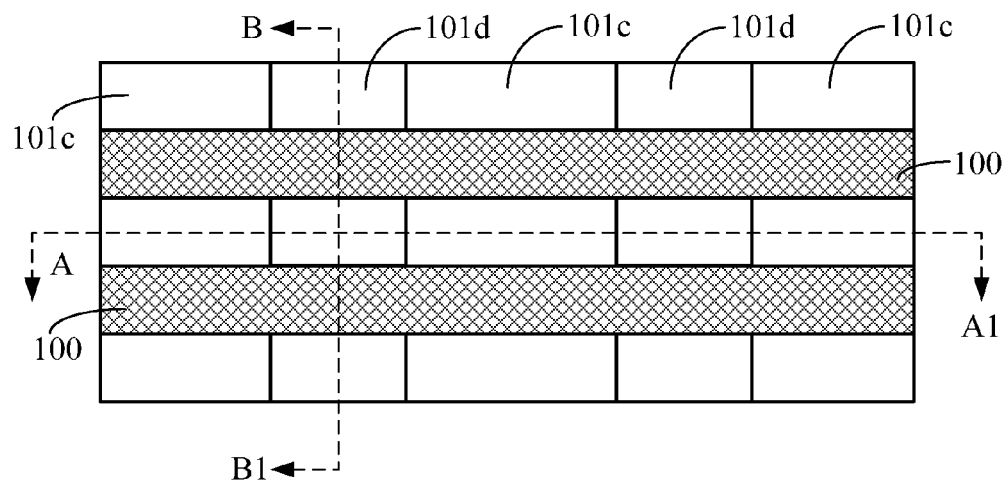
Figure 16:
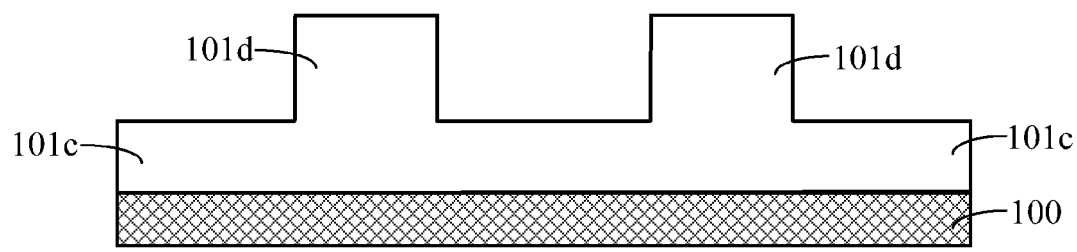
Figure 17:
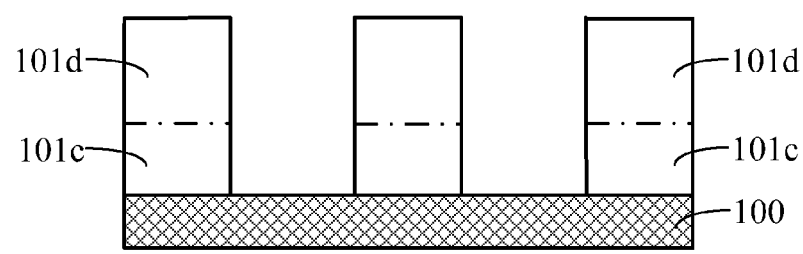

Returning to FIG. 20, after forming the metal lines 101c and the metal pillars 101d, the first mask layer 104a and the second mask layer 105a may be removed (S107). FIGS. 15~17 illustrate a corresponding structure. FIG. 16 is a cross-sectional view of the structure illustrated in FIG. 15 along the "AA1" direction; and FIG. 17 is a cross-sectional view of the structure illustrated in FIG. 15 along the "BB1" direction.

As shown in FIGS. 15~17, the first mask layer 104a and the second mask layer 105a (referring to FIGS. 12~14) are removed. The first mask layer 104a and the second mask layer 105a may be removed by any appropriate process, such as a dry etching process, or a wet etching process, etc. In one embodiment, a wet etching process is used to remove the first mask layer 104a and the second mask layer 105a. When the wet etching process is used to remove the first mask layer 104a and the second mask layer 105a, the meal lines 101c and the metal pillars 101d may not be etched.

In one embodiment, the first mask layer 104a and the second mask layer 105a are made of silicon oxide. The etching solution of the wet etching process for removing the first mask layer 104a and the second mask layer 105a may be HF solution. The volume ratio of HF and de-ionized water in the HF solution may be in a range of approximately 1:300~1:700.

In certain other embodiments, the first mask layer 104a and the second mask layer 105a are made of silicon nitride. The etching solution of the wet etching process for removing the first mask layer 104a and the second mask layer 105a may be phosphoric acid solution. The mass percentile of phosphoric acid in the phosphoric acid solution may be in a range of approximately 65%~85%. The temperature of the phosphoric acid may be in a range of approximately 80° C.~200° C.

Figure 18:
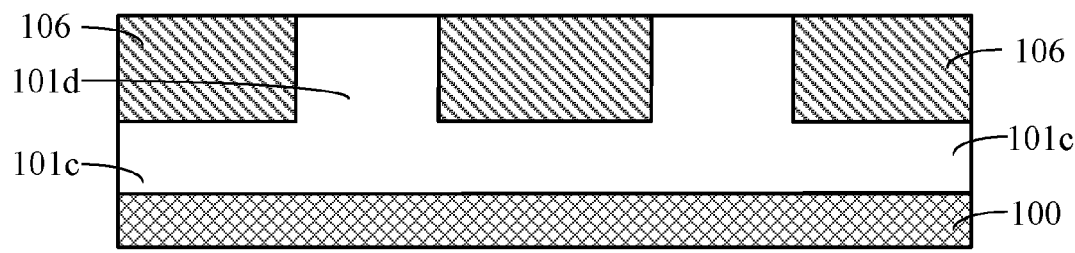

Returning to FIG. 20, after removing the first mask layer 104a and the second mask layer 105a, a dielectric layer may be formed (S108). FIGS. 18~19 illustrate a corresponding structure. FIG. 18 is the cross-sectional view of the structure illustrated in FIG. 15 along the "AA1' direction; and FIG. 19 is the cross-sectional view of the structure along the "BB1" direction as illustrated FIG. 15.

As shown in FIGS. 18~19, a dielectric layer 106 is formed. The dielectric layer 106 may cover the surface of the substrate 100, the surface of the metal lines 101c and the side surfaces of the metal pillars 101d. The dielectric layer 106 may be used to electrically insulate adjacent metal lines 101c and adjacent metal pillars 101d. Thus, metal lines and metal pillars with a Double-Damascene structure may be formed.

The dielectric layer 106 may be made of any appropriate material, such as silicon oxide, silicon nitride, silicon oxynitride, low-dielectric constant (low-K) material, or ultra-low-K material, etc. The low-K material may refer to the material having a dielectric constant equal to, or greater than approximately 2.5. The ultra-low-K material may refer to the material having a dielectric constant smaller than approximately 2.5. The low-K material or ultra-low-K material may include SiCOH, FSG (fluorine-doped silicon dioxide), BSG (boron-doped silicon dioxide), PSG (phosphor-doped silicon oxide), or BPSG (boron and phosphor co-doped silicon oxide), etc. In embodiment, in order to reduce the delay effect of the interconnect structure, the dielectric layer 106 is made of low-K material, or ultra-low-K material.

Various processes may be used to form the dielectric layer 106, such as a CVD process, a PVD process, or an ALD process, etc. In one embodiment, the dielectric layer 106 is formed by a high-aspect-ratio CVD (HARP CVD) process, or a flowable (FCVD) process.

In one embodiment, the metal lines 101c and the metal pillars 101d are formed by etching the metal layer 101. The grain size of the metal layer 101 may be relatively large. Thus, the grain size of the metal lines 101c and the metal pillars 101d may also be relatively large; and the grain boundary scattering of the metal lines 101c and the metal pillars 101*d* may be reduced to a desired level. Comparing with the metal lines and metal pillars formed by conventional methods, the resistivity of the metal lines 101*c* and the metal pillars 101*d* may be much lower. Therefore, the delay effect of the interconnect structure may be reduced; and the electrical properties of the interconnect structure may be enhanced.

Further, the low-K material and the ultra-low-K material may commonly be porous material; and it may be easily damaged by an etching process. In one embodiment, the dielectric layer 106 made of the low-K material or the ultra-low-K material may be formed after forming the metal lines 101*c* and the metal pillars 101*d*. Thus, the damage to the dielectric layer 106 caused by the etching processes for forming the metal lines 101*c* and the metal pillars 101*d* may be avoided. Therefore, the dielectric layer 106 may have a desired performance; and the reliability and the electrical properties of the interconnect structure may be further improved.

In one embodiment, the first mask film and the second mask film may be obtained by etching an initial mask layer; and then the portions of the first mask film exposed by the second mask film may be removed to form the first mask film and the second mask film. Further, the metal lines and the metal pillars may be formed by a same etching process (all-in-one etch). Thus, the production efficiency may be improved. In certain other embodiments, the first mask film may be formed first to be used to etch the initial metal lines and the initial metal pillars; and followed by forming the second mask film to etch the initial metal lines and the initial metal pillars. Thus, the metal lines may be formed; and a plurality of discrete metal pillars or vias may be formed on the surface of each of the metal lines.

In certain other embodiments, the metal pillars may be formed first; and then the metal lines may be formed to form the interconnect structure. Such a process may be referred as a pillar-first-line-last process. Specifically, the pillar-first-line-last process for forming the metal lines and the plurality of discrete metal pillars on each of the metal lines may include forming a second mask film on the surface of the metal layer before etching the metal layer, wherein the second mask film covers the portions of the metal layer corresponding to the position and the structure of the subsequently formed metal pillars; forming an initial metal line on the surface of the substrate and a plurality of initial metal pillars on the initial metal line by etching the metal layer with a pre-determined depth using the second mask film as an etching mask; removing the second mask film; forming a first mask film on the surface of the initial metal line and the initial metal pillars, wherein the first mask layer covers the portions of the initial metal line corresponding to the position and structure of the subsequently formed metal lines; and etching the initial metal line using the first mask film as an etching mask until the surface of the substrate is exposed. Thus, a plurality of metal lines may be formed on the surface of the substrate; and a plurality of metal pillars may be formed on each of the plurality of the metal lines.

In the pillar-first-line-last process, the initial metal pillars may be the final metal pillars. Thus, the thickness of the metal pillars may be identical to the initial metal pillars.

Therefore, the above described process may include etching the metal layer to form the initial metal line covering the surface of the substrate and the plurality of discrete initial metal pillars on the initial metal line; and followed by etching the initial metal line to form a plurality of discrete metal lines on surface of the substrate. The surface of each of the metal lines may have a plurality of discrete metal pillars. Therefore, the time for the substrate exposing in etching environments may be reduced; and the etching damage to the surface of the substrate may be effectively reduced.

In certain other embodiments, the metal lines and the plurality of metal pillars on the metal line may be formed by a line-first-pillar-last process. The line-first-pillar-last process may include etching a metal layer formed on the surface of a substrate to form a plurality of discrete initial metal lines; and followed by etching the initial metal lines with a pre-determined depth to form a plurality of the metal pillars on each of metal lines. Thus, the interconnect structure having a plurality of discrete metal lines and a plurality of the metal pillars on each of the metal lines may be formed. Comparing the previously described embodiments, after forming the initial metal lines on the surface of the substrate, portions of the surface of the substrate may be exposed.

In one exemplary embodiment, a process for forming the metal lines and the metal pillars by the line-first-pillar-last process may include forming the first mask film on the surface of the metal layer, wherein the first mask film may cover the portions of the metal film corresponding the position and the structure of the subsequently formed metal lines; forming the second mask film on the first mask film, wherein the second mask film may cover portions of the metal layer corresponding to the position and the structure of the subsequently formed metal pillars; etching the metal layer exposed by the first mask film using the first mask film and the second mask film as an etching mask until the surface of the substrate is exposed to form a plurality of initial metal lines on the surface of the substrate; etching the portions of the first mask film exposed by the second mask film to formed a first mask layer on the initial metal lines and a second mask layer on the first mask layer; etching the initial metal lines with a pre-determined depth using the second mask layer as an etching mask to form a plurality of discrete metal lines on the surface of the substrate and a plurality of metal pillars on each of the metal lines; and forming a dielectric layer covering the surface of substrate, the surfaces of the metal lines, and the side surfaces of the metal pillars.

The material and the fabrication process of the first mask film and the second mask film may be similar as previously described. In one embodiment, the first mask film and the second mask film may be formed by patterning a same initial mask layer. The first mask film and the second mask film may be made of a same material; and the thickness of the second mask film may be greater than the thickness of the second mask film. When the plurality of the initial metal lines are being formed, the portions of the first mask film exposed by the second mask film may be removed simultaneously. The process for etching the meal layer, the process for etching portion of the first mask film and the process for etching the initial metal lines with a pre-determined depth may be performed in a same reaction chamber.

In certain other embodiments, the first mask film defining the metal lines and the second mask film defining the metal pillars may be formed separately. Specifically, a process for forming the metal lines and the metal pillars by the line-first-pillar-last process may include forming a first mask film on the metal layer, wherein the mask film may cover the portions of the metal layer corresponding to the position and structure of the subsequently formed metal lines; forming a plurality of discrete initial metal lines by etching the metal layer until the surface of the substrate is exposed using the first mask film as an etching mask; forming a second mask film on the initial metal lines, wherein the second mask film may cover portions of the initial metal lines corresponding to the position and structures of the subsequently formed metal pillars; and etching the initial metal lines with a pre-determined depth using the second mask film to form a plurality of discrete metal lines on the surface of the substrate and a plurality of metal pillars on each of the plurality of the metal lines; and forming a dielectric layer covering the surface of the substrate, the surface of the metal lines and the side surfaces of the metal pillars.

Thus, an interconnect structure may be formed by the above disclosed processes and methods; and the corresponding semiconductor structure is illustrated in FIGS. 18~19. As shown in FIGS. 18~19, the interconnect structure includes a substrate 100; and a plurality of metal lines 101c formed on the surface of the substrate 100. The interconnect structure also includes a plurality of metal pillars 101d on each of the metal lines; and a dielectric layer 106 covering the surface of the substrate, the surfaces of the metal lines 101c and the side surfaces of the metal pillars 101d for electrically insulating adjacent metal pillars. The detailed structures and intermediate structures are described above with respect to the fabrication processes.

Therefore, according to the disclosed processes and structures, the metal layer may be formed on the surface of the substrate. The size of the metal layer may be identical to the size of the substrate. Thus, the size of the metal layer may be relatively large. The relatively large size of the metal layer may enable the growth of the crystal grain of the metal layer to have a significantly small limitation. Thus, the crystal grains of the metal layer may be relatively large; and the grain boundaries may be relatively small. Therefore, the grain boundary scattering of the metal lines and the metal pillars may be relatively small. The relatively small grain boundary scattering of the metal lines and metal pillars may cause the metal lines and the metal pillar to have a relatively low resistivity. Thus, the electrical properties and the reliability of the interconnect structure metal be enhanced.

Further, the dielectric layer may be formed on the surface of the substrate and the surfaces of the metal lines and the side surfaces of the metal pillars after forming the metal lines and the metal pillars, the dielectric layer may not be damaged by the etching process for forming the metal lines and the metal pillars. Thus, the dielectric layer may have desired performance; and the electrical properties and the reliability of the interconnect structure may be further enhanced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an interconnect structure, comprising:
   providing a substrate with a surface;
   forming a metal layer covering the surface of the substrate and with a desired grain size to reduce grain boundary scattering of the interconnect structure subsequently formed with the metal layer;
   forming a first mask film on the metal layer;
   forming a second mask film on the first mask film;
   etching the metal layer to form a plurality of metal lines on the surface of the substrate and a plurality of metal pillars on each of the plurality of the metal lines of the interconnect structure, wherein the positions of the plurality of metal lines corresponds to the positions of the first mask film and positions of the plurality of metal pillars corresponds to the positions of the second mask film; and
   forming a dielectric layer covering the surface of the substrate, surfaces of the metal lines, and side surfaces of the metal pillars.

2. The method according to claim 1, wherein forming the plurality of the metal lines and the plurality of metal pillars further includes:
   etching the metal layer to form an initial metal line on the surface of the substrate and a plurality of the initial metal pillars on the initial metal line; and
   etching the initial metal line to form the plurality of the metal lines on the surface of the substrate and the plurality of metal pillars on each of the metal lines.

3. The method according to claim 2, wherein forming the plurality of the metal lines and the plurality of metal pillars further includes:
   etching portions of the metal layer exposed by the first mask film with a pre-determined depth using the first mask film as an etching mask to form the initial metal line on the surface of the substrate and the plurality of initial metal pillars on the initial metal line;
   etching to remove portions of the first mask film exposed by the second mask film to form a first mask layer covering portions of surfaces of the initial meal pillars and a second mask layer on the first mask layer; and
   etching the initial metal lines using the second mask layer as an etching mask until the surface of the substrate is exposed and etching the initial metal pillars to form the plurality of the metal lines on the surface of the substrate and the plurality of the metal pillars on each of the metal lines, simultaneously.

4. The method according to claim 3, wherein:
   the metal layer, the first mask film and the initial metal lines are etched in a same reaction chamber.

5. The method according to claim 3, wherein:
   the first mask film and the second mask film are formed by patterning a same initial mask layer.

6. The method according to claim 5, wherein:
   the initial mask layer is one of a single layer structure and multiple layer structure made of one of photoresist, back antireflective material, organic spin-coating layer material and top antireflective material.

7. The method according to claim 3, wherein:
   a thickness of the metal pillar is equal to a difference between a thickness of the metal layer and a thickness of the initial metal pillars; and
   a thickness of the metal lines is equal to the thickness of the initial metal pillars.

8. The method according to claim 3, wherein:
   the first mask film and the second mask film are made of a same material; and
   a thickness of the second mask film is greater than a thickness of the first mask film.

9. The method according to claim 3, wherein:
   the first mask film is made of one or more of silicon nitride, silicon oxide, silicon carbide, silicon oxynitride, silicon nitrocarbide; and
   the second mask film is made of one or more of silicon nitride, silicon oxide, silicon carbide, silicon oxynitride, silicon nitrocarbide.

10. The method according to claim 2, wherein forming the plurality of the metal lines and the plurality of metal pillars further includes:
- forming a second mask layer covering portions of the metal layer corresponding to position and structure of the subsequently formed metal pillars on the metal layer before etching the metal layer;
- etching the metal layer with a pre-determined depth using the second mask layer as an etching mask to form the initial metal line covering the surface of the substrate and the plurality of the initial metal pillars on the initial metal lines;
- removing the second mask layer;
- forming a first mask layer covering portions of metal lines corresponding to position and structure of the subsequently formed metal lines on surface of the initial metal line and surfaces of the initial metal pillars; and
- etching the initial metal line using the first mask layer as an etching mask until the surface of the substrate is exposed to form the plurality of metal lines on the surface of the substrate and the plurality of the metal pillars on each of the metal lines.

11. The method according to claim 1, wherein forming the plurality of the metal lines and the plurality of metal pillars further includes:
- etching the metal layer to form a plurality of initial metal lines on the surface of the substrate; and
- etching the initial metal lines to form the plurality of metal lines on the surface of the substrate and the plurality of the metal pillars on etch of the metal lines.

12. The method according to claim 11, wherein forming the plurality of the metal lines and the plurality of metal pillars further includes:
- etching portions of the metal layer exposed by the first mask film until the surface of the substrate is exposed using the first mask film and the second mask film as an etching mask to formed a plurality of initial metal lines on the surface of the substrate;
- etching portions of the first mask film exposed by the second mask film to form a first mask layer covering portions of the initial metal lines and a second mask layer on the first mask layer; and
- etching the initial metal lines with a pre-determined depth using the second mask layer as an etching mask to form the plurality of metal lines on the surface of the substrate and the plurality of the metal pillars on each of the metal lines.

13. The method according to claim 12, wherein:
the process for etching the metal layer, the process for etching the first mask film and the process for etching the initial metal lines are performed in a same reaction chamber.

14. The method according to claim 11, wherein forming the plurality of the metal lines and the plurality of metal pillars further includes:
- forming a first mask film covering portions of the surface of the metal layer corresponding to position and structure of the subsequently formed metal lines on the metal layer;
- etching the metal layer until the surface of the substrate is exposed using the first mask film as an etching mask to form a plurality of initial metal lines;
- forming a second mask film covering portions of the surface the initial metal lines corresponding to the subsequently formed metal pillars on the initial metal lines; and
- etching the initial metal lines with a pre-determined depth using the second mask film as an etching mask to form the plurality of metal lines and the plurality of metal pillars on each of the metal lines.

15. The method according to claim 1, wherein:
the metal layer is etched by a dry etching process; and the etching gas includes $H_2$.

* * * * *